(12) United States Patent
Won et al.

(10) Patent No.: US 7,833,580 B2
(45) Date of Patent: Nov. 16, 2010

(54) METHOD OF FORMING A CARBON NANO-MATERIAL LAYER USING A CYCLIC DEPOSITION TECHNIQUE

(75) Inventors: Seok-Jun Won, Seoul (KR); Dae-Jin Kwon, Seoul (KR); Yong-Kuk Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 930 days.

(21) Appl. No.: 10/859,166

(22) Filed: Jun. 3, 2004

(65) Prior Publication Data

US 2005/0003089 A1    Jan. 6, 2005

(30) Foreign Application Priority Data

Jul. 4, 2003    (KR) .............................. 2003-45447
Mar. 30, 2004   (KR) .............................. 2004-21824

(51) Int. Cl.
*C23C 18/00*    (2006.01)
*C23C 16/26*    (2006.01)
(52) U.S. Cl. ............... 427/249.1; 427/248.1; 427/249.6
(58) Field of Classification Search ............... 427/248.1
See application file for complete search history.

(56) References Cited

U.S. PATENT DOCUMENTS

| | | | | |
|---|---|---|---|---|
| 5,728,425 A | * | 3/1998 | Ebe et al. ................. | 427/248.1 |
| 6,346,488 B1 | * | 2/2002 | Kabansky ................... | 438/783 |
| 6,350,488 B1 | * | 2/2002 | Lee et al. .................. | 427/249.1 |
| 2001/0034123 A1 | * | 10/2001 | Jeon et al. ................... | 438/643 |
| 2002/0102353 A1 | * | 8/2002 | Mauthner et al. ...... | 427/255.28 |
| 2003/0099592 A1 | * | 5/2003 | Rodriguez et al. .......... | 423/445 |
| 2003/0134038 A1 | * | 7/2003 | Paranjpe .................. | 427/248.1 |
| 2005/0104044 A1 | * | 5/2005 | Kambara et al. ............ | 252/500 |

FOREIGN PATENT DOCUMENTS

| KR | 10-0335383 | 4/2002 |
|---|---|---|
| KR | 10-2003-0028296 | 4/2003 |

OTHER PUBLICATIONS

Sumio Iijima, "Helical Microtubules of Graphitic Carbon", Nature, vol. 354, pp. 56-58, Nov. 7, 1991.

* cited by examiner

*Primary Examiner*—Michael Cleveland
*Assistant Examiner*—Michael G Miller
(74) *Attorney, Agent, or Firm*—Harness, Dickey & Pierce, P.L.C.

(57) ABSTRACT

A method of forming a carbon nano-material layer may involve a cyclic deposition technique. In the method, a chemisorption layer or a chemical vapor deposition layer may be formed on a substrate. Impurities may be removed from the chemisorption layer or the chemical vapor deposition layer to form a carbon atoms layer on the substrate. More than one carbon atoms layer may be formed by repeating the method.

31 Claims, 6 Drawing Sheets

US 7,833,580 B2

METHOD OF FORMING A CARBON NANO-MATERIAL LAYER USING A CYCLIC DEPOSITION TECHNIQUE

This application claims priority under 35 U.S.C. §119 to Korean Patent Application Nos. 2003-0045447 and 2004-0021824, filed on Jul. 4, 2003 and on Mar. 30, 2004, respectively, the contents of which are incorporated by reference in their entirety.

BACKGROUND OF INVENTION

1. Field of the Invention

The present invention relates in general to a method of forming a carbon nano-material layer, and more particularly, to a method of forming a carbon nano-material layer using a cyclic deposition technique.

2. Description of Related Art

Carbon may have four types of crystal structures such as diamond, graphite, fullerene, and carbon nanotube (CNT). Fullerene and CNT may be considered as carbon nano-materials. Fullerene may be composed of sixty carbon atoms and may be a 64-hedron with a soccer ball shape. CNT may be formed into hexagonal honeycomb structures wound into a tube shape, in which there are several types of shapes such as a single wall shape, a multi-wall shape, and a rope shape, for example.

CNT may have the property of an electric conductor or a semiconductor due to the wound shape, and may have excellent mechanical, electrical and chemical characteristics. For these reasons, CNT may be a suitable material for use in highly-integrated memory devices, ultra high capacity capacitors, secondary batteries, high sensitivity sensors, high strength-ultra light complex materials, electromagnetic waves-shielding materials, field emission displays (FEDs), and the like.

CNT may have been first introduced in NATURE (Vol. 354, pp. 56-58, 7 Nov. 1991) in a research paper by Sumio Iijima entitled "HELICAL MICROTUBULES OF GRAPHITIC CARBON". The research paper indicates that materials including CNT may be produced by an arc discharge between two graphites. Subsequently, methods of forming a carbon nano-material, such as a laser ablation, electrochemical method, chemical vapor deposition (CVD) method and plasma enhanced CVD method, have been introduced. However, the above methods are not without shortcomings. For example, conventional forming techniques may tend to involve relatively high substrate temperatures, generate carbon particles by gas phase reaction, and/or suffer from carbon particles interfering with the formation of a carbon nano-material layer having a desired shape and property.

In electronic devices such as a highly-integrated semiconductor device, and when forming such a carbon nano-material layer on the highly-integrated semiconductor device, a need may exist for a method of forming a carbon nano-material layer at relatively low temperatures, and for preventing the generation of carbon particles that may interfere with the formation of a carbon nano-material layer with desired shapes and properties.

SUMMARY OF THE INVENTION

Exemplary embodiments of the present invention may provide a method of forming a carbon nano-material layer using a cyclic deposition technique.

In an exemplary embodiment, the method may involve loading a substrate into a reactor. A source gas may be injected into the reactor for a first period of time to form a chemisorption layer including carbon atoms on the substrate. After the chemisorption layer is formed, a purge gas may be injected into the reactor and the gases may be exhausted for a second period of time to exhaust the source gas remaining in the reactor. A reactant gas may be injected into the reactor for a third period of time to remove atoms other than carbon from the chemisorption layer, and to form a carbon atoms layer on the substrate. A purge gas may be injected into the reactor and the gases may be exhausted for a fourth period of time to exhaust the reactant gas remaining in the reactor and the gases generated by the chemical reaction of the reactant gas and the chemisorption layer. In an exemplary embodiment, method may be repeated at least once (i.e., performed a total of at least two times) to create the carbon nano-material layer.

In another exemplary embodiment, the method of forming a carbon nano-material layer may further include the injection of a catalyst gas while the source gas and/or the reactant gas are injected. The catalyst gas may be first injected before the injection of the source gas or the reactant gas, and may be continuously injected during the injection of the source gas or the reactant gas.

In accordance with an exemplary embodiment, the method may involve loading a substrate into a reactor. A source gas may be injected into the reactor for a first period of time to form a chemisorption layer including carbon atoms on the substrate. After the chemisorption layer is formed, and before the source gas in the reactor is completely exhausted, a reactant gas may be injected into the reactor for a second period of time to form a chemical vapor deposition (CVD) layer by a chemical reaction of the chemisorption layer, the source gas and the reactant gas. The chemical reaction may be accelerated by activating the reactant gas by using plasma or light. Impurities remaining in the CVD layer may be removed by a reaction with atoms of the reactant gas remaining in the reactor after the source gas is completely exhausted.

In accordance with an exemplary embodiment, the method may involve loading a substrate into a reactor, and supplying a source gas and a first reactant gas into the reactor during a first period of time, to form a CVD layer containing carbon atoms on the substrate inside the reactor. The source gas may be exhausted out of the reactor during a second period of time. A second reactant gas may be injected into the reactor during a third period of time to remove impurities from the CVD layer.

In another exemplary embodiment, impurities, which are removed from the CVD layer, may be exhausted out of the reactor during a fourth period of time.

A first purge gas may be injected into the reactor during the second period of time, to accelerate the exhaust of the source gas, and a second purge gas may be injected into the reactor during the fourth period of time, to accelerate the exhaust of the impurities out of the reactor.

The source gas and/or the first reactant gas may be excited by using plasma or light during the injection of the source gas and the first reactant gas. Thus, the CVD layer may be easily formed. Further, the second reactant gas may be excited by using plasma or light during the injection of the second reactant gas. Thus, impurities may be easily removed from the CVD layer.

The first and the second reactant gases may be a same gas. The reactant gas may be injected into the reactor during the second and the fourth periods of time. That is, the reactant gas may be continuously injected.

The injection of the source gas, and the first and the second reactant gases may be repeated until a desired film thickness is achieved. The first and the second reactant gases may be a same gas. The first and the second reactant gases may be continuously injected until a desired film thickness is achieved.

BRIEF DESCRIPTION OF THE DRAWINGS

Exemplary embodiments of the present invention will be readily apparent to those of ordinary skill in the art upon review of the detailed description that follows when taken in conjunction with the accompanying drawings, in which like reference numerals denote like parts.

DETAILED DESCRIPTION OF EXEMPLARY EMBODIMENTS

Figure 1:
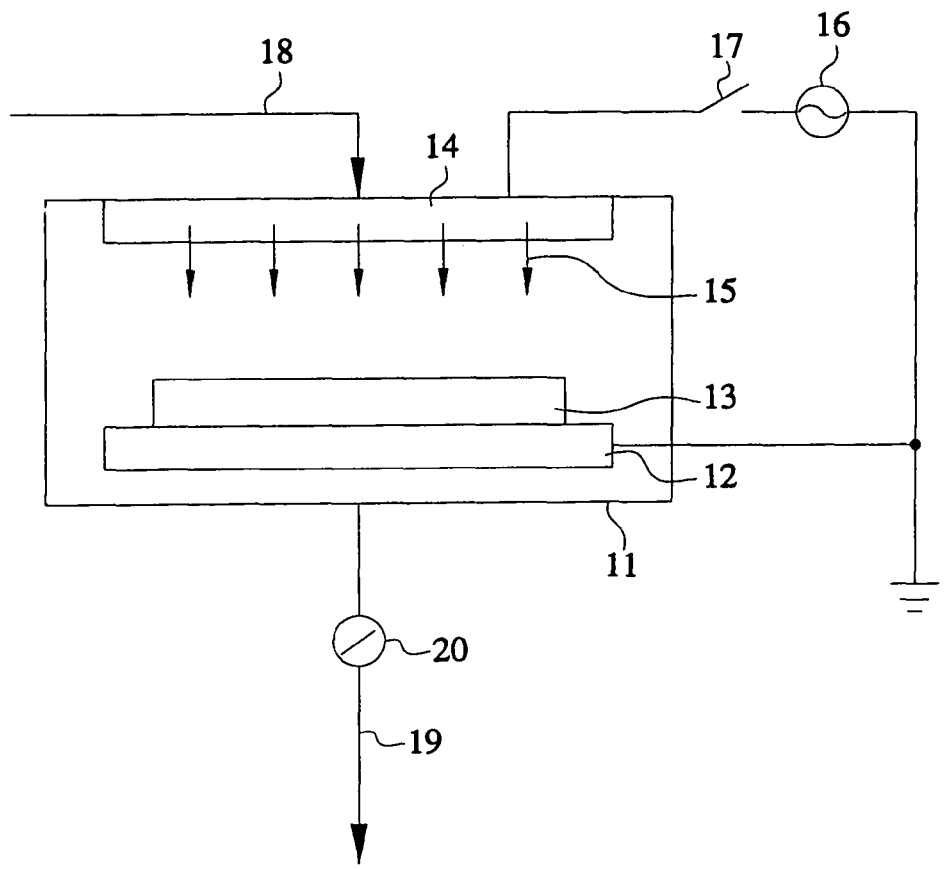
FIG. 1 is a schematic view of a typical cyclic deposition apparatus.

Reference will now be made to exemplary, non-limiting embodiments of the present invention, which are illustrated in the accompanying drawings. It will be appreciated that the present invention is not limited by any of the details of the exemplary embodiments explained herein, but instead may be embodied in numerous and varied forms. The exemplary embodiments of the present invention are provided merely to thoroughly completely convey ideas of the present invention to those skilled in the art. The drawings are not drawn to scale. For example, a thickness of the illustrated layers may be exaggerated to improve clarity. In the drawing, same reference numerals are used for the same elements.

FIG. 1 schematically shows a typical cyclic deposition apparatus using a direct plasma. This apparatus may be used to implement embodiments of the present invention. As shown, a reactor 11 may contain a susceptor 12. The susceptor may support a substrate 13 and transfer heat to maintain the appropriate temperature of the substrate 13. A gas showerhead 14 may be provided to disperse a gas 15 uniformly. An RF power supply 16 may be connected to the susceptor 12 and the gas showerhead 14. The RF power supply 16 may apply an RF power to the reactor 11 to generate plasma above the substrate 13.

A switch 17 may be provided on an RF power supply line to the gas showerhead 14. The switch may control (e.g., connect or disconnect) the supply of the RF power to the gas showerhead 14 in accordance with a period of time for supplying a gas. A gas may be injected into the reactor 11 through a gas supply line 18. The gas from the gas supply line 18, which may not be deposited on the substrate 13, may be exhausted out of the reactor 11 through an exhaust line 19 by an exhaust pump 20.

It will be appreciated that the apparatus used to implement the exemplary embodiments of the present invention is not limited to the typical direct plasma cyclic deposition apparatus shown in FIG. 1. For example, an indirect plasma cyclic deposition apparatus may be employed, in which an extra chamber may be further installed outside the reactor 11. Plasma may be generated inside the extra chamber. A supply gas may be injected into the reactor 11 through the chamber, and activated in accordance with a period of time for supplying a gas. Further, a lamp (e.g., a UV lamp) may be installed inside the reactor 11 and turned on or off in accordance with a period of time for supplying a gas in order to activate a supply gas.

A lamp or plasma may be used to excite gases, which may require excitation. However, a lamp or plasma is optional when the supplied gases do not require excitation. In such a case, a more simply structured apparatus may be used.

Figure 2:
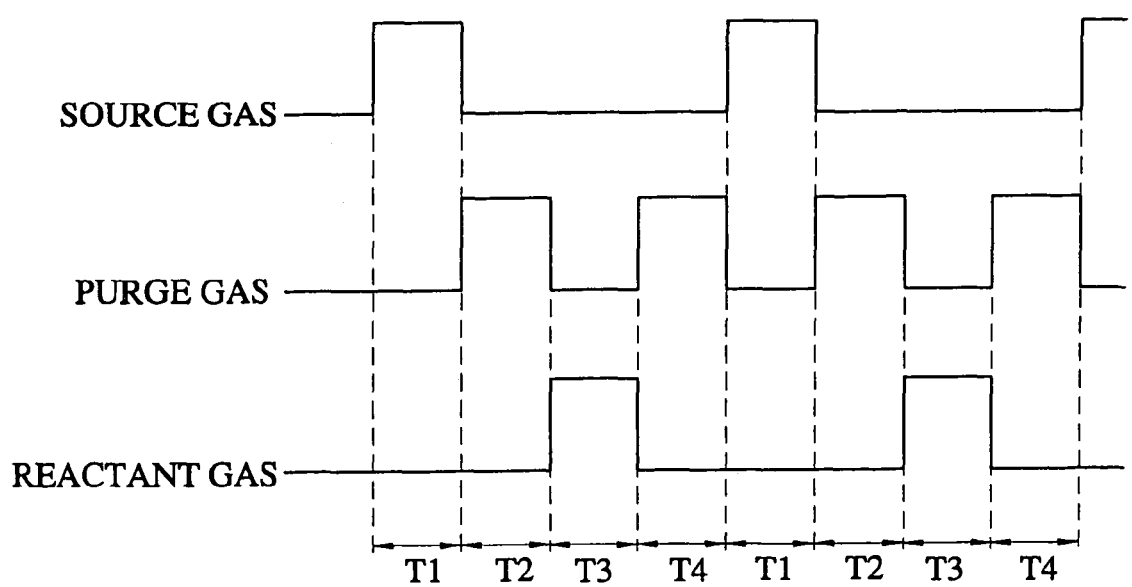
FIG. 2 is a timing diagram for a method of forming a carbon nano-material layer according to an exemplary embodiment of the present invention.

FIG. 2 is a timing diagram for a method of forming a carbon nano-material layer according to one exemplary embodiment of the present invention.

Referring to FIGS. 1 and 2, the substrate 13 may be loaded into the reactor 11. A source gas may be periodically injected into the reactor 11 during each first period of time T1. For example, the source gas may be injected for 0.1 to 10 seconds, and in one exemplary embodiment, the injection period is 0.5 to 5 seconds.

The source gas may be a gas of a hydrocarbon ($C_xH_y$) system. In one exemplary embodiment, the hydrocarbon is one of $CH_4$ and $C_2H_2$.

The substrate 13 may be kept at a process temperature such that the source gas is not thermally decomposed, but is chemically adsorbed on the substrate 13. The substrate 13 may be kept at a temperature in the range of 100° C. to 600° C. As a result, a chemisorption layer, essentially composed of carbon atoms and hydrogen atoms, may be formed on the substrate 13 during the first period of time T1.

The temperature range in which the source gas may be chemically adsorbed, not thermally decomposed, may be defined as an atomic layer deposition (ALD) process temperature. Since the change of deposition rate according to temperature within the ALD process temperature range may be small, the ALD process temperature may be easily detected by plotting the deposition rate of a thin layer according to temperature.

To facilitate the formation of the chemisorption layer at a low temperature, a catalytic metal layer formed of, for example, a transition metal layer may be formed on the substrate 13 before the substrate 13 is loaded into the reactor 11. An exemplary embodiment of the catalytic metal layer will be explained in detail below with reference to FIG. 4A.

Further, before the chemisorption layer is formed on the substrate 13, the upper surface of the substrate 13 may be cleaned to facilitate the formation of a carbon nano-material layer, and/or a surface-treatment gas may be injected into the reactor 11 to change the property of the upper surface of the substrate 13. The surface-treatment gas may be used to reduce the size of grains in the catalytic metal layer when the catalytic metal layer is formed on the substrate 13.

The surface-treatment gas may be injected for 1 to 1000 seconds. The surface-treatment gas may be at least one gas selected from the group consisting of $H_2$, $N_2$, $O_2$, $NH_3$, $O_3$ and $H_2O$. Further, the surface-treatment gas may be excited by using plasma or light.

A catalyst gas of an amine system may be injected along with the source gas to facilitate the formation of the chemisorption layer. The catalyst gas may be first injected before the injection of the source gas, and may be continuously injected while the source gas is injected.

The catalyst gas of an amine system may be at least one gas selected from the group consisting of pyridine ($C_5H_5N$), trimethyl amine ($(CH_3)_3N$), triethyl amine ($(C_2H_5)_3N$), dimethyl amine ($(CH_3)_2NH$), and ammonia ($NH_3$). Ammonia ($NH_3$) may be more commonly used.

Referring again to FIG. 2, after the chemisorption layer is formed, the source gas remaining in the reactor 11 may be exhausted during a second period of time T2. A time for exhausting the source gas may be, for example, 0.1 to 10 seconds. In one exemplary embodiment, the source gas may be exhausted for 0.5 to 5 seconds. Further, to reduce the exhaust time, a purge gas including an inert gas may be injected. The purge gas may be at least one inert gas selected from the group consisting of nitrogen ($N_2$), oxygen ($O_2$), helium (He), hydrogen ($H_2$) and argon (Ar). In one exemplary embodiment, argon (Ar) gas may be used.

After the source gas is exhausted, a reactant gas may be injected into the reactor 11 during a third period of time T3. The reactant gas may be injected, for example, for 0.1 to 10 seconds. In one exemplary embodiment, the reactant gas may be injected for 0.5 to 5 seconds.

The reactant gas may be at least one gas selected from the group consisting of hydrogen ($H_2$), water vapor ($H_2O$) and ammonia ($NH_3$). Alternatively, the reactant gas may include hydrogen ($H_2$) gas, and at least one gas selected from the group consisting of nitrogen ($N_2$), oxygen ($O_2$) and ozone ($O_3$) gases.

Since the reactant gas includes hydrogen radicals, the reactant gas and the hydrogen atoms in the chemisorption layer may react to generate hydrogen gas. As a result, the hydrogen atoms in the chemisorption layer may be removed, and a carbon atoms layer, composed of carbon atoms, may be formed on the substrate 13. The carbon atoms layer may be a fine thin film formed on the substrate 13 and may include more than one single atomic layer of carbon atoms.

While the reactant gas is injected, a catalyst gas of an amine system may be injected to facilitate the reaction of the chemisorption layer and the reactant gas. The catalyst gas may be injected before the injection of the reactant gas, and may be continuously injected during the injection of the reactant gas. The catalyst gas of an amine system may facilitate the formation of the carbon atoms layer.

After the carbon atoms layer is formed, the reactant gas remaining in the reactor 11 may be exhausted during a fourth period of time T4. The time for exhausting the reactant gas may be, for example, 0.1 to 10 seconds. In one exemplary embodiment, the fourth period of time T4 may be 0.5 to 5 seconds.

A purge gas, being composed of an inert gas, may be injected to reduce the time for exhausting the reactant gas. The purge gas injected for the fourth period of time T4 may be at least one inert gas selected from the group consisting of nitrogen ($N_2$), oxygen ($O_2$), helium (He), hydrogen ($H_2$), and argon (Ar). In one exemplary embodiment, argon (Ar) may be used.

The purge gas injected for the fourth period of time T4 may differ from the purge gas used during the second period of time T2, and may be selected based on the specie of the reactant gas. However, a same purge gas (e.g., argon (Ar) gas) may be used during both the second and the fourth periods of time T2 and T4.

The sequential injection of the source gas, the purge gas, the reactant gas and the purge gas may be performed repeatedly. As a result, the carbon atoms layers may be stacked to form a carbon nano-material layer.

To improve the property of the carbon thin layer formed by the cyclic deposition, a post-treatment gas may be injected into the reactor 11 after the final period of time is completed. The post-treatment gas may be injected for 1 to 1000 seconds. The post-treatment gas may be at least one selected from the group consisting of $H_2$, $N_2$, $O_2$, $NH_3$, $O_3$, and $H_2O$. The post-treatment gas may be excited by plasma or light.

According to the exemplary embodiment of the present invention, the temperature of the substrate may be reduced during the formation processes, and the gas phase reaction may be suppressed so as to prevent the generation of particles. Furthermore, since each period of time for injecting a gas to be supplied may be finely controlled based on predetermined time schedules, and a carbon nano-material layer may be formed of the stacked fine thin films, each film composed of one single carbon atoms layer, the carbon nano-material layer may be finally formed with desired shapes and properties.

Figure 3:
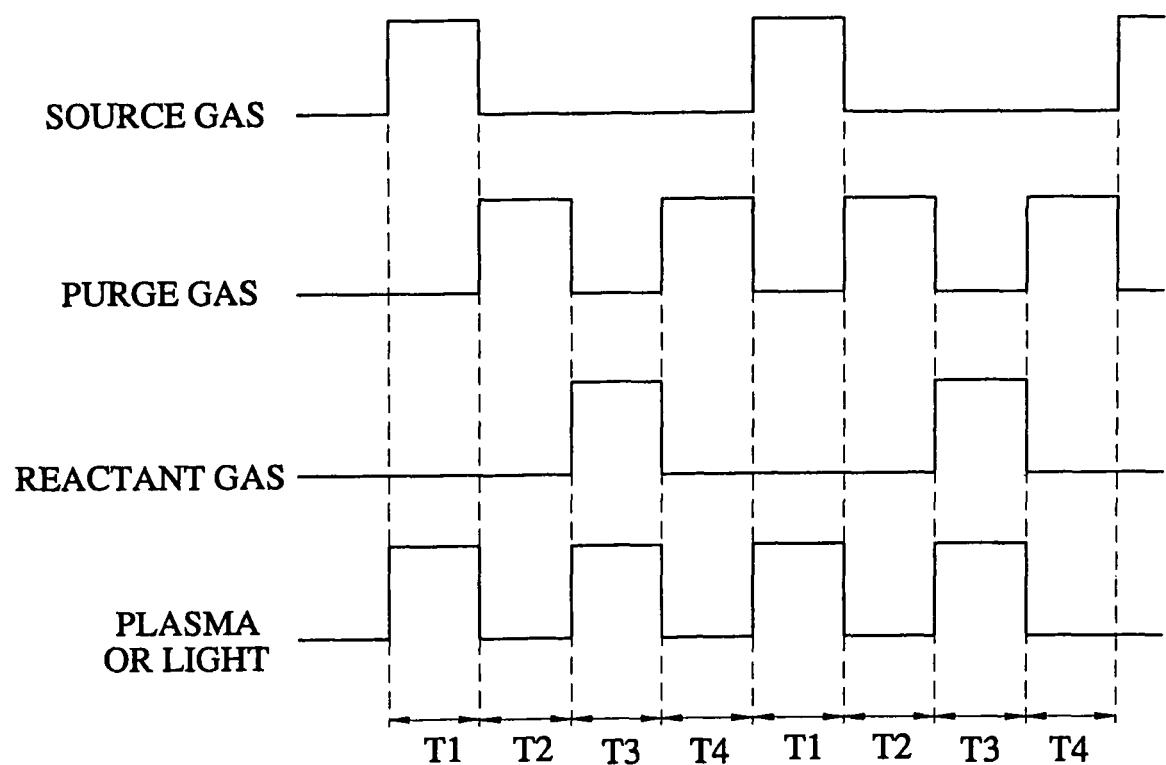
FIG. 3 is a timing diagram for a method of forming a carbon nano-material layer according to another exemplary embodiment of the present invention.

FIG. 3 is a timing diagram for a method of forming a carbon nano-material layer according to another exemplary embodiment of the present invention.

Referring to FIGS. 1 and 3, in a similar way as explained with reference to FIGS. 1 and 2, the substrate 13 may be loaded into the reactor 11, and a source gas, a purge gas, a reactant gas, and a purge gas may be sequentially injected into the reactor 11 in the order of T1→T2→T3→T4.

Further, as described with reference to FIG. 2, a catalyst gas, a surface-treatment gas, and/or a post-treatment gas may be injected into the reactor 11 for an appropriate time.

Further, the use of plasma or light may be employed in accordance with a period of time for injecting the source gas and/or the reactant gas to activate the source gas and/or the reactant gas. The plasma may be generated by turning on the switch 17 connected to the RF power supply 16 (FIG. 1), and the light may be generated by connecting a power to the lamp (not shown) installed in the reactor 11.

The plasma or the light may be generated in accordance with a period of time for injecting either one of the source gas or the reactant gas, as shown in FIG. 3, or may be generated in accordance with a period of time for both gases.

If the source gas is excited by the plasma or the light, the energy of the source gas may increase, and a chemisorption layer may be formed on a substrate even at a low temperature. And if the reactant gas is excited by the plasma or the light, the activation energy of the reactant gas may increase, and the reaction of the reactant gas with the hydrogen atoms in the chemisorption layer may increase. That is, an activated reactant gas may remove the hydrogen atoms in the chemisorption layer better than a non-activated reactant gas. Therefore, with the use of the activated reactant gas, a purer carbon atoms layer may be formed, and the time for removing the hydrogen atoms may be reduced.

As a result, by using plasma or light to activate the source gas and/or the reactant gas, the temperature of the substrate may be reduced, and a time for the total formation process may be reduced. Also, a highly pure carbon nano-material layer may be formed.

FIGS. 4A to 4D are cross sectional views of a product at various stages of a method of forming a carbon nano-material layer according to one exemplary embodiment of the present invention.

Figure 4A:
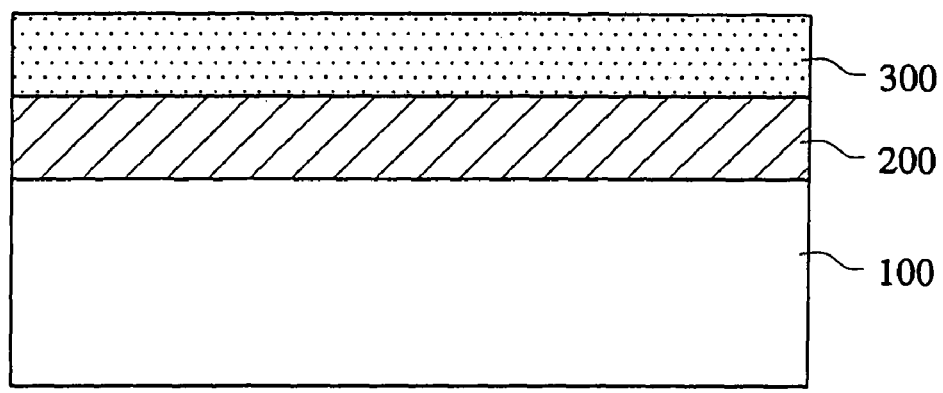
FIGS. 4A to 4D are cross sectional views of a product at various stages of a method of forming a carbon nano-material layer according to an exemplary embodiment of the present invention.

Referring to FIG. 4A, a substrate 100 may be loaded into the reactor 11 (FIG. 1), and as shown in FIG. 2, a source gas may be injected into the reactor 11 for a first period of time T1 so as to form a first chemisorption layer 300 on the substrate 100.

As described with reference to FIG. 2, before loading the substrate 100 into the reactor 11, a catalytic metal layer 200 may be formed on the substrate 100 to facilitate the formation of the first chemisorption layer 300. The catalytic metal layer 200 may be formed of a metal layer selected from the group consisting of a nickel (Ni), cobalt (Co), iron (Fe), and ruthenium (Ru), or formed of an alloy layer that may be composed of at least two elements from among the above group.

Since the carbon nano-material layer may have a low resistivity, it may be used in highly-integrated semiconductor devices to reduce a via resistance thereof. For this purpose, an insulating layer may be formed on the catalytic metal layer 200. A via hole may be formed in the insulating layer to expose the catalytic metal layer 200. Then, a carbon nano-material layer may be formed on the exposed catalytic metal layer 200 to reduce the via resistance.

Figure 4B:
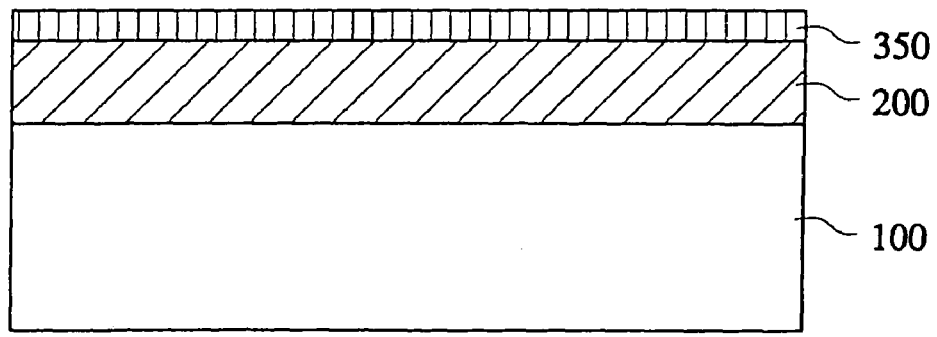

Referring to FIG. 4B, after the first chemisorption layer 300 is formed, the source gas may be exhausted and a reactant gas may be injected into the reactor 11 to form a carbon atoms layer 350. The reactant gas may remove the hydrogen atoms in the first chemisorption layer 300 to form the carbon atoms layer 350 on the substrate 100.

Figure 4C:
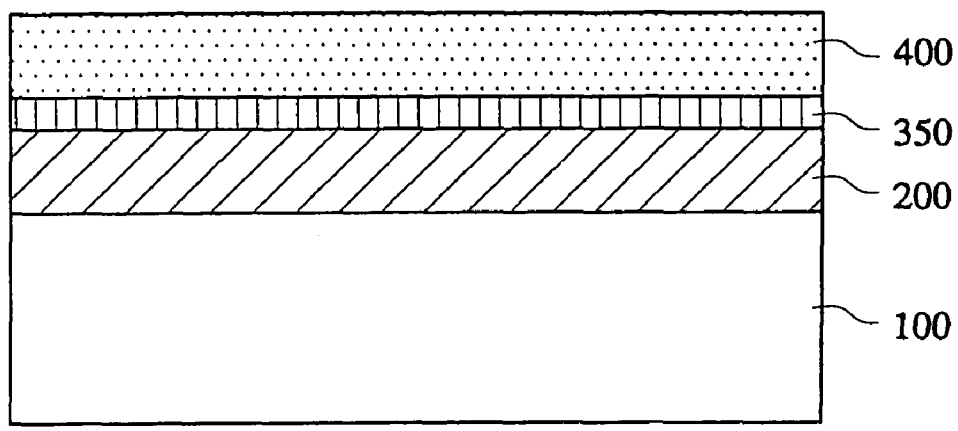

Referring to FIG. 4C, after the carbon atoms layer 350 is formed, the reactant gas may be exhausted. Then, as described with reference to FIG. 4A, a source gas may be injected again. As a result, a second chemisorption layer 400 may be formed on the carbon atoms layer 350.

Figure 4D:
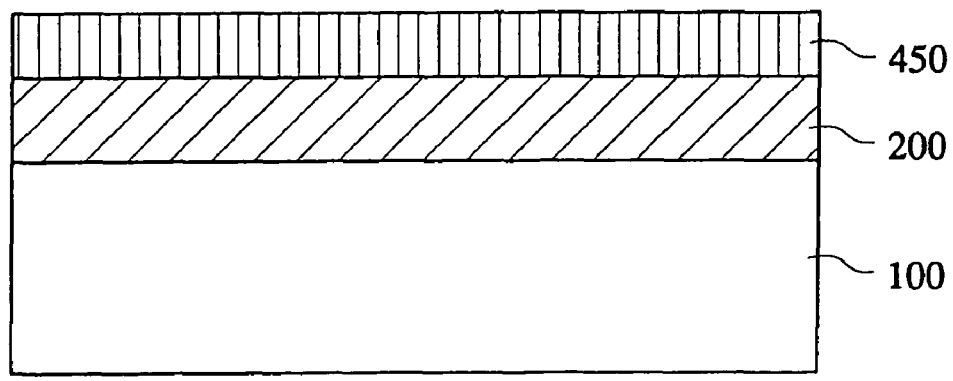

Referring to FIG. 4D, after the second chemisorption layer 400 is formed, the source gas may be exhausted out of the reactor 11. Then, as described with reference to FIG. 4B, a reactant gas may be injected again. The reactant gas may remove the hydrogen atoms in the second chemisorption layer 400. As a result, another carbon atoms layer may be formed on the carbon atoms layer 350 of FIG. 4C, and a carbon nano-material layer 450 may be formed.

The sequential injection of the source gas and the reactant gas may be performed repeatedly so as to form the carbon nano-material layer with a desired thickness. In an exemplary embodiment, the process to form a carbon atoms layer may be performed at least twice to form the carbon nano-material layer.

Figure 5:
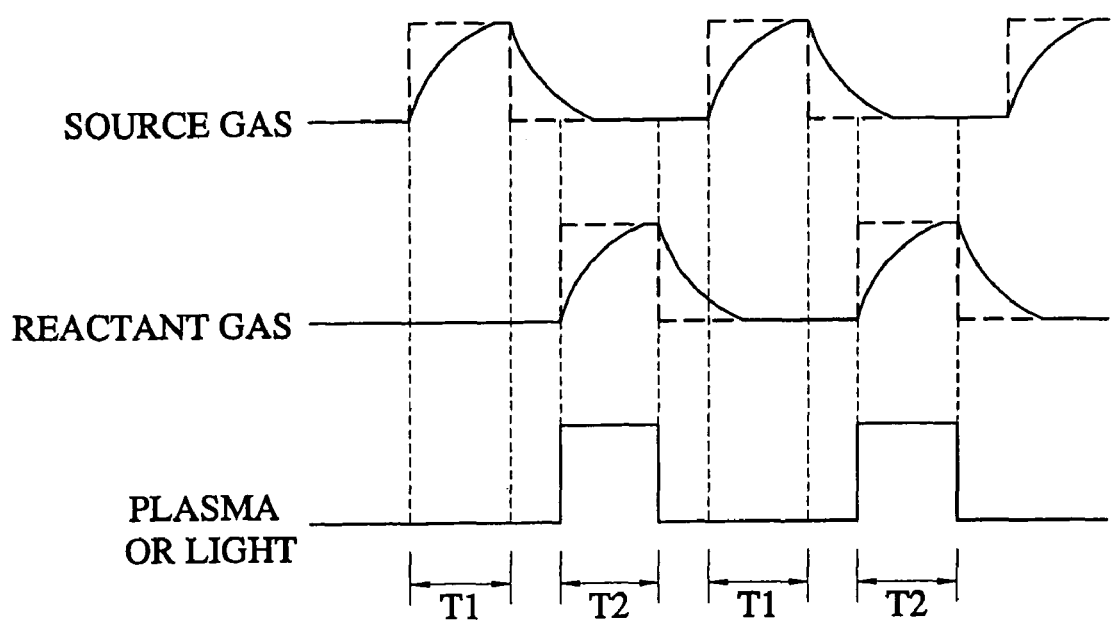
FIG. 5 is a timing diagram for a method of forming a carbon nano-material layer according to another exemplary embodiment of the present invention.

FIG. 5 is a timing diagram for a method of forming a carbon nano-material layer according to another exemplary embodiment of the present invention. Here, the dotted lines in the timing diagram of the source gas and the reactant gas show the supply period of time for each gas, and the solid lines show the amount of each gas remaining in the reactor.

Referring to FIG. 5, a source gas may be injected into the reactor 11 of FIG. 1 for a first period of time T1 to form a chemisorption layer on the substrate 13 of FIG. 1. The source gas may be excited by plasma or light, and as described with reference to FIG. 2, a catalyst gas may be also injected along with the source gas.

Before the source gas is completely exhausted out of the reactor 11, a reactant gas may be injected into the reactor 11 for a second period of time T2. As described with reference to FIG. 2, a catalyst gas may be injected along with the reactant gas.

During the injection of the reactant gas, plasma or light may be applied in accordance with the injection period of time to activate the reactant gas. As a result, the source gas remaining in the reactor 11, the reactant gas, and the chemisorption layer may cause a chemical reaction so as to form a chemical vapor deposition (CVD) layer on the substrate 13.

The hydrogen atoms in the chemisorption layer may be mostly removed by the chemical reaction. However, the CVD layer may include impurities other than a carbon nano-material, that is, carbon particles and hydrogen atoms.

After the source gas is completely exhausted out of the reactor 11, the reactant gas activated by the plasma or the light may be injected into the reactor 11 for a predetermined period of time. The activated reactant gas may react with the hydrogen atoms in the CVD layer to additionally remove the hydrogen atoms from the above layers, and to remove the carbon particles, formed on the CVD layer, by a physical or chemical reaction. As a result, an initial carbon nano-material layer may be formed on the substrate 13.

Further, as described in reference to FIG. 2, a catalyst gas may be injected together with the reactant gas. Further, the reactant gas may be excited by using plasma or light during the injection of the reactant gas. As the reactant gas is excited, the CVD layer may be easily formed. Further, the excited reactant gas may easily remove the hydrogen atoms and the carbon particles from the CVD layer.

By repeatedly performing the sequential injection of the source gas and the reactant gas, a final carbon nano-material layer having a desired thickness may be formed.

When a time interval between each period of time for injecting the source gas and the reactant gas exists, a purge gas may be injected to reduce the time for exhausting each gas.

According to the exemplary embodiment of the present invention, the thickness of the carbon nano-material layer formed during one period of time may be relatively thick, which may reduce a process time for forming a final carbon nano-material layer.

Figure 6:
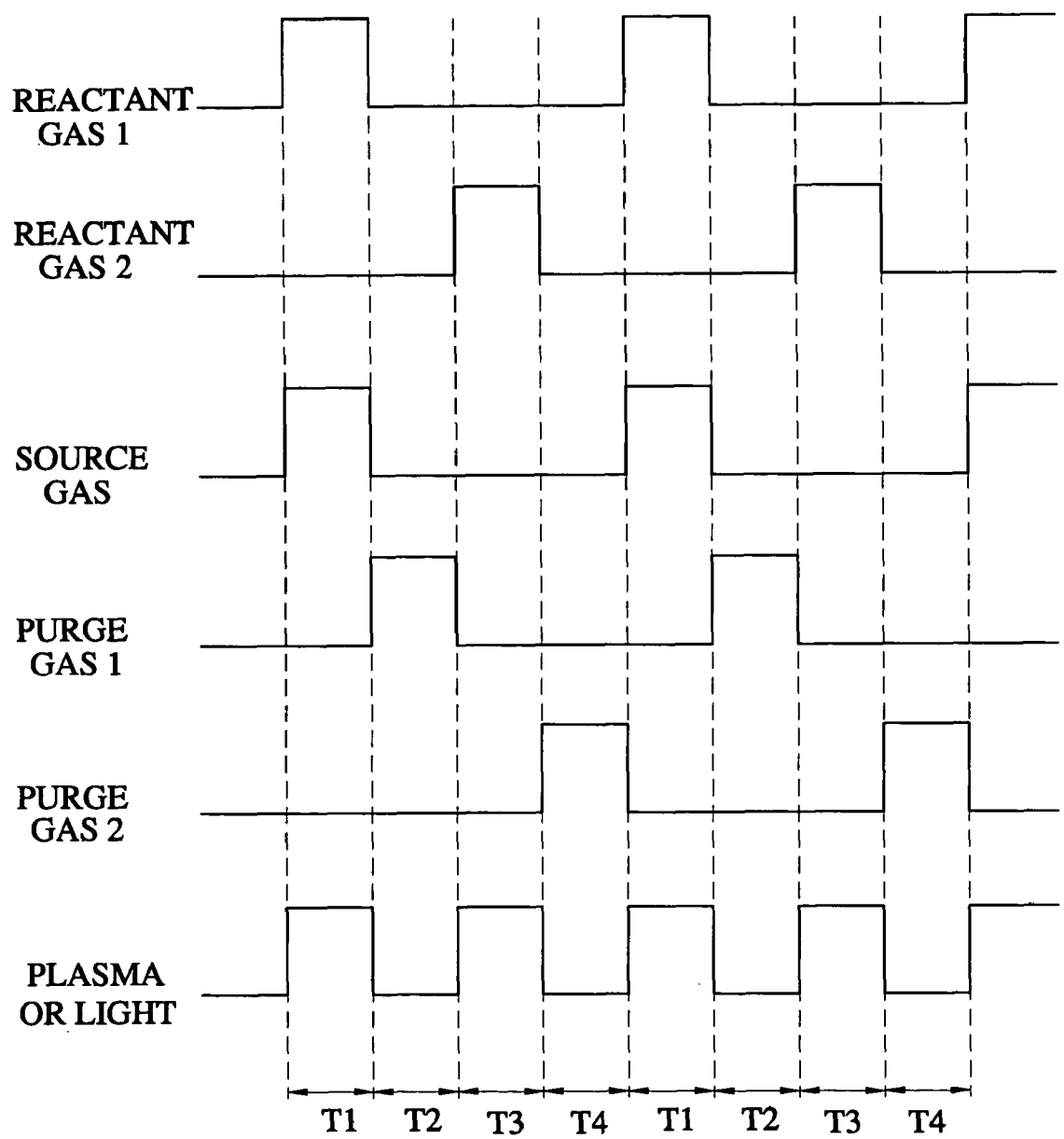
FIG. 6 is a timing diagram for a method of forming a carbon nano-material layer according to another exemplary embodiment of the present invention.

FIG. 6 is a timing diagram showing a method of forming a carbon nano-material layer according to another exemplary embodiment of the present invention.

Referring to FIG. 6, a source gas and a first reactant gas may be injected into the reactor 11 of FIG. 1 for a first period of time T1 to form a CVD layer on the substrate 13 of FIG. 1. The source gas and/or the first reactant gas may be excited by the plasma or the light. As the source gas and/or the first reactant gas are excited, the CVD layer may be easily formed, to reduce a temperature of the substrate. Further, as described above with reference to FIG. 2, a catalyst gas may be injected along with the source gas.

The source gas may be exhausted out of the reactor 11 for a second period of time T2. A first purge gas may be injected into the reactor 11 for the second period of time T2, to accelerate the exhaust of the source gas.

After the source gas is exhausted out of the reactor 11, a second reactant gas may injected into the reactor 11 during a third period of time T3. The second reactant gas may react with the CVD layer to remove impurities, except for carbon nano-material, i.e., the carbon particles and the hydrogen atoms. Using plasma or light, the second reactant gas may be excited. The excited second reactant gas may react with the CVD layer, to easily remove the carbon particles and the hydrogen atoms. Further, as described above with reference to FIG. 2, a catalyst gas may be injected along with the second reactant gas. As a result, an initial carbon nano-material layer is formed on the substrate 13.

The impurities, which may be removed from the CVD layer, may be exhausted out of the reactor 11 during a fourth period of time T4. A second purge gas may be injected into the reactor 11, to accelerate the exhaust of the impurities out of the reactor 11.

The sequential injection of the source gas, and the first and second reactant gases may be performed repeatedly until a carbon nano-material layer is formed on the substrate 13 with a predetermined thickness. As a result, the carbon nano-material layer may be formed on the substrate 13 with a predetermined thickness.

The first and the second purge gases may be at least one inert gas selected from the group consisting of nitrogen ($N_2$), oxygen ($O_2$), helium (He), hydrogen ($H_2$) and argon (Ar), and preferably argon (Ar) gas.

The first and the second reactant gases may be at least one gas selected from the group consisting of hydrogen ($H_2$), water vapor ($H_2O$) and ammonia ($NH_3$). The first and the second reactant gases may include hydrogen ($H_2$) gas, and at least one gas selected from the group consisting of nitrogen ($N_2$), oxygen ($O_2$) and ozone ($O_3$) gases.

The first and the second reactant gases may be the same kind of a gas. If the first and the second reactant gases are an identical gas, then the reactant gas may be injected into the reactor 11 continuously. That is, the reactant gas may be injected into the reactor 11 during the second T2 and the fourth T4 periods of time as well as the first T1 and the third T3 periods of time. The reactant gas may be excited using plasma or light even during the second period of time T2 and/or the fourth period of time T4.

According to the exemplary embodiments, since the thickness of the carbon nano-material layer, formed during one period of time, may be thick, a processing time for forming a final carbon nano-material layer with the same thickness may be reduced.

According to the exemplary embodiments of the present invention, the temperature of the substrate to form a carbon nano-material layer may be reduced, and detrimental carbon particles may be prevented from being generated. Further, since fine carbon atoms layers, each layer being very thin, are stacked to form a carbon nano-material layer, the carbon nano-material layer may be formed with desired shapes and properties.

While the present invention has been particularly shown and described with reference to exemplary embodiments thereof, it will be understood by those skilled in the art that the foregoing and other changes in form and details may be made therein without departing from the spirit and scope of the present invention.

What is claimed is:

1. A method of forming a carbon nano-material layer, the method comprising:
   supplying a source gas into a reactor to chemically absorb the source gas on a substrate and to form a chemisorption layer on the substrate in the reactor, wherein the chemisorption layer includes carbon atoms and the substrate has a temperature of 100° C. to 600° C. to prevent thermal decomposition of the source gas; and
   supplying a reactant gas into the reactor to remove atoms other than carbon from the chemisorption layer and form a carbon atoms layer on the substrate,
   wherein the carbon nano-material layer is formed using an atomic layer deposition (ALD) process.

2. The method of claim 1, further comprising forming a catalytic metal layer on the substrate before providing the substrate into the reactor.

3. The method of claim 2, wherein the catalytic metal layer is formed of at least one layer selected from the group consisting of Ni, Co, Fe and Ru layers.

4. The method of claim 1, wherein the source gas is a gas of a hydrocarbon ($C_xH_y$) system.

5. The method of claim 4, wherein the source gas is at least one gas selected from the group consisting of $CH_4$ and $C_2H_2$.

6. The method of claim 1, further comprising:
   supplying a catalyst gas of an amine system into the reactor during the supplying a source gas step to accelerate the formation of the chemisorption layer.

7. The method of claim 6, wherein the catalyst gas of an amine system, supplied during the supplying a source gas step, is at least one gas selected from the group consisting of $C_5H_5N$, $(CH_3)_3N$, $(C_2H_5)_3N$, $(CH_3)_2NH$ and $NH_3$.

8. The method of claim 6, further comprising:
   supplying a catalyst gas of an amine system into the reactor during the supplying a reactant gas step to accelerate the removal of the hydrogen atoms from the chemisorption layer.

9. The method of claim 8, wherein the catalyst gas of an amine system, supplied during the supplying a reactant gas step, is at least one gas selected from the group consisting of $C_5H_5N$, $(CH_3)_3N$, $(C_2H_5)_3N$, $(CH_3)_2NH$ and $NH_3$.

10. The method of claim 8, wherein the catalyst gas supplied during the supplying a source gas step and the catalyst gas supplied during the supplying a reactant gas step are different gases.

11. The method of claim 8, wherein the catalyst gas supplied during the supplying a source gas step and the catalyst gas supplied during the supplying a reactant gas step are a same gas.

12. The method of claim 1, further comprising:
   first purging the source gas from the reactor before the supplying a reactant gas step; and
   second purging the reactant gas from the reactor after the supplying a reactant gas step.

13. The method of claim 12, further comprising:
   supplying a first purge gas into the reactor during the first purging step; and
   supplying a second purge gas into the reactor during the second purging step.

14. The method of claim 13, wherein the first purge gas is at least one gas selected from the group consisting of $N_2$, $O_2$, He, $H_2$ and Ar.

15. The method of claim 13, wherein the second purge gas is at least one gas selected from the group consisting of $N_2$, $O_2$, He, $H_2$ and Ar.

16. The method of claim 13, wherein the first and the second purge gases are Ar.

17. The method of claim 12, further comprising:
   repeating the supplying a source gas step, the first purging step, the supplying a reactant gas step, and the second purging step.

18. The method of claim 1, wherein the reactant gas is at least one gas selected from the group consisting of $H_2$, $H_2O$ and $NH_3$.

19. The method of claim 1, wherein the reactant gas comprises $H_2$ gas, and at least one gas selected from the group consisting of $N_2$, $O_2$ and $O_3$.

20. The method of claim 1, further comprising:
   exciting the source gas during the supplying a source gas step.

21. The method of claim 1, further comprising:
   exciting the reactant gas during the supplying a reactant gas step.

22. The method of claim 1, further comprising:
   supplying a surface-treatment gas into the reactor to treat a surface of the substrate before the supplying a source gas step.

23. The method of claim 22, wherein the surface-treatment gas is at least one gas selected from the group consisting of $H_2$, $N_2$, $O_2$, $NH_3$, $O_3$ and $H_2O$.

24. The method of claim 1, further comprising:
   supplying a post-treatment gas for removing impurities.

25. The method of claim 24, wherein the post-treatment gas is at least one gas selected from the group consisting of $H_2$, $N_2$, $O_2$, $NH_3$, $O_3$ and $H_2O$.

26. A method of forming a carbon nano-material layer using an atomic layer deposition (ALD) process and a chemical vapor deposition (CVD) process, the method comprising:
supplying a source gas into a reactor to chemically absorb the source gas on a substrate using the atomic layer deposition (ALD) process and to form a chemisorption layer on the substrate in the reactor, wherein the chemisorption layer includes carbon atoms and the substrate has a temperature of 100° C. to 600° C. to prevent thermal decomposition of the source gas;
exhausting the source gas from the reactor; and
supplying a reactant gas into the reactor before the source gas is completely exhausted out of the reactor to form a chemical vapor deposition (CVD) layer by reaction of the chemisorption layer, the source gas and the reactant gas using the chemical vapor deposition (CVD) process.

27. The method of claim 26, wherein the supplying a reactant gas step continues to supply the reactant gas after the source gas has been exhausted out of the reactor.

28. The method of claim 27, further comprising:
exciting at least one of the source and the reactant gases.

29. The method of claim 26, wherein the supplying a source gas step and the supplying a reactant gas step are repeated until a desired film thickness is achieved.

30. A method of forming a carbon nano-material layer, the method comprising:
supplying a source gas into a reactor to form a chemisorption layer on a substrate in the reactor, wherein the source gas includes carbon and hydrogen atoms and the chemisorption layer includes the carbon and hydrogen atoms; and
supplying a reactant gas into the reactor to remove atoms other than carbon from the chemisorption layer and to form a carbon atoms layer,
wherein the chemisorption layer is formed by chemically absorbing the source gas on the substrate and the substrate has a temperature to prevent thermal decomposition of the source gas, and
the carbon nano-material layer is formed using an atomic layer deposition (ALD) process.

31. A method of forming a carbon nano-material layer using an atomic layer deposition (ALD) process and a chemical vapor deposition (CVD) process, the method comprising:
supplying a source gas into a reactor to form a chemisorption layer using the atomic layer deposition (ALD) process on a substrate in the reactor, wherein the source gas includes carbon and hydrogen atoms and the chemisorption layer includes the carbon and hydrogen atoms;
exhausting the source gas from the reactor; and
supplying a reactant gas into the reactor before the source gas is completely exhausted out of the reactor to form a chemical vapor deposition (CVD) layer by reaction of the chemisorption layer using the chemical vapor deposition (CVD) process, the source gas and the reactant gas,
wherein the chemisorption layer is formed by chemically absorbing the source gas on the substrate and the substrate has a temperature to prevent thermal decomposition of the source gas before the reactant gas is supplied into the reactor.

* * * * *